United States Patent
Chen et al.

(10) Patent No.: US 10,409,339 B2
(45) Date of Patent: *Sep. 10, 2019

(54) COMPACT TOOL-LESS GENERAL PURPOSE GRAPHIC PROCESSING UNITS (GPGPU) CARRIER

(71) Applicant: QUANTA COMPUTER INC., Taoyuan (TW)

(72) Inventors: Chao-Jung Chen, Taoyuan (TW); Yaw-Tzorng Tsorng, Taoyuan (TW); Chen Tseng, Taoyuan (TW); Zhi-Hao Tseng, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/210,981

(22) Filed: Dec. 5, 2018

(65) Prior Publication Data

US 2019/0138066 A1 May 9, 2019

Related U.S. Application Data

(63) Continuation of application No. 15/807,337, filed on Nov. 8, 2017, now Pat. No. 10,185,373.

(51) Int. Cl.
*G06F 1/18* (2006.01)
*G06F 1/16* (2006.01)

(52) U.S. Cl.
CPC ............ *G06F 1/186* (2013.01); *G06F 1/1633* (2013.01); *G06F 1/185* (2013.01); *H01L 2924/10* (2013.01); *H01L 2924/15* (2013.01)

(58) Field of Classification Search
CPC .......... G06F 1/186; G06F 1/185; G06F 1/187; G06F 1/18; G06F 1/184; H01L 2924/10;
(Continued)

(56) References Cited

U.S. PATENT DOCUMENTS 6,288,911 B1  9/2001 Aoki et al.
6,404,641 B1  6/2002 Fisk et al.
(Continued)

FOREIGN PATENT DOCUMENTS

CN  103593001 B  10/2016
TW  201136490 A  10/2011
TW  M470480 U  1/2014

OTHER PUBLICATIONS

TW Office Action for ApplicationNo. 107102240,dated Aug. 23, 2018,w/ First Office Action Summary.
(Continued)

*Primary Examiner* — Abhishek M Rathod
(74) *Attorney, Agent, or Firm* — Nixon Peabody LLP; Zhou Lu (57) ABSTRACT

A computing device is provided with a slot that includes a first locking element and a second locking element configured to receive a removable computing device carrier. The computing device carrier includes a bracket for securing a first computing device in a first receiving space, and second computing device in a second receiving space. The bracket also includes a first latching mechanism configured to secure the first locking element of the slot, and a second latching mechanism configured to secure the second locking element of the slot. The computing device carrier also includes a frame secured to the bracket. The frame includes a first end with a first guide slot, and a second end with a second guide slot. The first and second guide slots are configured to enable the computing device carrier to adjust from a first position to a second position while secured within the slot.

20 Claims, 13 Drawing Sheets

(58) Field of Classification Search
CPC .............. H01L 2924/15; H05K 7/1487; H05K 7/1409; H05K 7/1407; H05K 7/1424; G11B 33/128; G11B 33/124
See application file for complete search history.

(56) References Cited

U.S. PATENT DOCUMENTS

| | | |
|---|---|---|
| 9,913,394 B2 | 3/2018 | Blume et al. |
| 2004/0074082 A1 | 4/2004 | Kim et al. |
| 2005/0097580 A1* | 5/2005 | Lee ..................... G11B 33/022 |
| | | 720/600 |
| 2012/0127649 A1 | 5/2012 | Chen et al. |
| 2013/0027875 A1 | 1/2013 | Zhu et al. |
| 2014/0233182 A1 | 8/2014 | Demange |
| 2015/0123519 A1 | 5/2015 | Chen et al. |
| 2016/0021778 A1 | 1/2016 | Chen et al. |
| 2016/0042768 A1 | 2/2016 | Yang et al. |
| 2017/0293325 A1 | 10/2017 | Chen et al. |

OTHER PUBLICATIONS

TW Search Report for ApplicationNo. 107102240,dated Aug. 23, 2018, w/ First Office Action.
Corrected Notice of Allowance in U.S. Appl. No. 15/807,337, dated Oct. 3, 2018.
Notice of Allowance in U.S. Appl. No. 15/807,337, dated Sep. 11, 2018.

* cited by examiner

FIG. 13

COMPACT TOOL-LESS GENERAL PURPOSE GRAPHIC PROCESSING UNITS (GPGPU) CARRIER

CROSS-REFERENCE TO RELATED APPLICATIONS

This application is a Continuation of U.S. Non-Provisional application Ser. No. 15/807,337, entitled, "Compact Tool-Less General Purpose Graphic Processing Units (GPGPU) Carrier," filed Nov. 8, 2017, the contents of which are incorporated by reference in their entirety as if fully set forth herein.

FIELD OF THE INVENTION

The present invention relates to a general purpose graphic processing unit (GPGPU) carriers, and more specifically to compact and tool-less GPGPU carriers.

BACKGROUND

General purpose graphic processing units (GPGPUs) are commonly utilized to perform computation in applications traditionally handled by a central processing unit (CPU). Even a single GPU-CPU framework provides advantages that multiple CPUs on their own do not offer due to the specialization in each chip. While GPUs operate at lower frequencies, they typically have many times the number of cores. Thus, GPUs can effectively operate on pictures and graphical data far faster than a traditional CPU. Migrating data into graphical form, and then using the GPU to scan and analyze it, can result in profound speedup.

Removing a GPGPU from many types of computer systems today, requires tools and involves pulling cables from cable sockets. Overtime, or through incorrect usage, these cables or sockets become frail and can introduce data transfer errors associated with the GPGPU in use. Installing a GPGPU is not any easier because it involves similar hardships.

Furthermore, a computer data center (also referred to as an Internet data center or an enterprise data center) may contain a myriad of computer systems utilizing various GPGPUs. The large number of high-capacity GPGPUs in a data center poses significant problems associated with their removal and installation. The time and skills involved in removing or installing GPGPUs, without damage, in a data center can become burdensome.

Accordingly, it is becoming extremely important for various reasons (such as data backup and generally a GPGPU) to be able to easily, quickly, and efficiently remove and install a GPGPU in a computer system.

SUMMARY

Embodiments of the invention concern compact and tool-less general purpose graphic processing unit (GPGPU) carriers. A computing device, according to the various embodiments, can include an enclosure with at least one slot; the at least one drive slot including a first locking element; and a second locking element configured to receive the GPGPU carrier. The computing device also includes the GPGPU carrier for removable insertion into the at least one slot. The GPGPU carrier includes a bracket. The bracket includes a first receiving space for securing a first GPGPU. The bracket can also include a second receiving space for securing a second GPGPU. The bracket can also include a first latching mechanism configured to secure the first locking element of the slot, and a second latching mechanism configured to secure the second locking element of the slot. In some embodiments, the GPGPU carrier can include a frame secured to the bracket. In some embodiments, the frame can include a first end with a first guide slot configured, and a second end with a second guide slot configured, to secure the GPGPU carrier within the slot. The first and second guide slots are configured to enable the GPGPU carrier to adjust from a first position to a second position while secured within the slot.

In an exemplary embodiment of the computing device, the frame is secured to the bracket by at least one of fasteners, screws, and spot welding. In some embodiments of the computing device, the GPGPU carrier further comprises a PCIe interface connected to a PCIe cable. In some embodiments, the first locking mechanism and the second locking mechanism comprise a latch mechanism. In an alternative embodiment, the first locking mechanism and the second locking mechanism comprises a spring and lock mechanism. In some embodiments, the slot can include a connector for engaging a corresponding connector of the GPGPU carrier.

DETAILED DESCRIPTION

The present invention is described with reference to the attached figures, wherein like reference numerals are used throughout the figures to designate similar or equivalent elements. The figures are not drawn to scale, and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

As discussed above, there is significant interest in developing means to efficiently and reliably add or remove a GPGPU for a computer system. In particular, there is significant interest in developing means that: (1) do not require tools to install a GPGPU into a computer system; (2) minimize space requirements for the GPGPU in the computer system; and (3) reduce or eliminate instances of incorrect installation of the GPGPU, which can result in damage to the GPGPU, the computer system, or connectors there between.

In view of the foregoing, the present disclosure contemplates a GPGPU carrier design for a computer system and computer systems therefrom that address the foregoing requirements. In particular, the present disclosure contemplates: (1) a GPGPU carrier design that allows a technician to easily and reliably install a GPGPU in the GPGPU carrier; and (2) a corresponding drive slot design for a computer system that allows mechanical and electrical installation of the GPGPU in the computer system with minimal effort and training on the part of the technician. Such a design is illustrated in FIGS. 1-13. While the present application is directed towards a carrier for multiple GPGPUs, the present application can be expanded to any component that can be combined within a single carrier. This could realize space savings for the server as some components can be placed in similar brackets. Further, coupling similar components within the same bracket as described in the present disclosure enables service without disconnecting the carrier's components.

Figure 1:
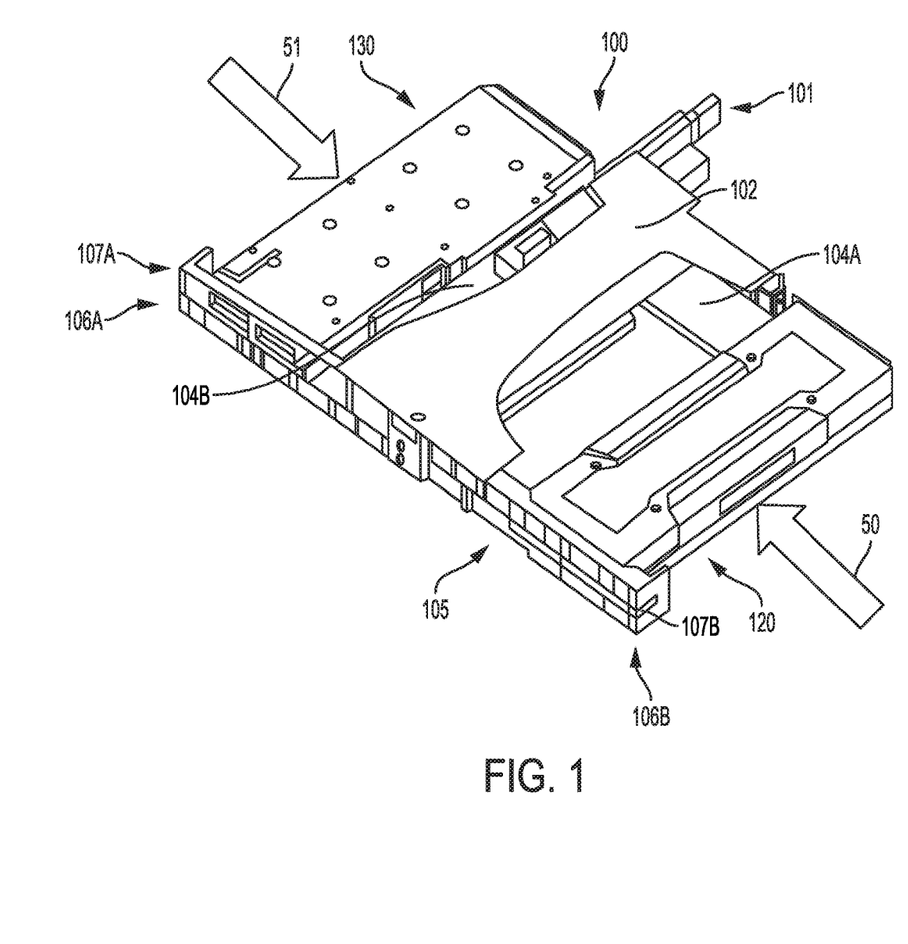
FIG. 1 is a top isometric views of a GPGPU carrier according to an embodiment.

FIG. 1 is a top isometric view of a GPGPU carrier 100 according to an embodiment. As shown in FIG. 1, the GPGPU carrier 100 includes a bracket 102 with a first receiving space 104A and a second receiving space 104B. The first receiving space 104A can receive a first GPGPU 120. The first GPGPU 120 can be inserted into the first receiving space 104A in direction 50. The second receiving space 104B can receive a second GPGPU 130. The second GPGPU 130 can be inserted into the second receiving space 104B in direction 51. The GPGPU carrier 100 can also include a frame 105. The frame 105 can be connected to the bracket 102 by known connection means. For example, the frame 105 can be secured to the bracket 102 by way of fasteners, screws, or spot welding. In some embodiments, the frame 105 and the bracket 102 can be made from a single element, such as plastic, metal, ceramics, and other high quality 3D printing materials.

The GPGPU carrier 100 and its components can be made of sheet metal using conventional metal fabrication techniques such as bending, forming, and stamping. As a result, the GPGPU carrier 100 can be made very inexpensively. Alternatively, the GPGPU carrier 100 and its components can be made of aluminum alloy, steel alloy, or any combination thereof. It should be realized that the GPGPU carrier 100 and its components can be made of any material constructed to withstand varying temperatures, and air flow of high velocity (from a plurality of fan modules not shown). The materials mentioned above are only for example, and not to limit this disclosure. A person having ordinary knowledge in the art may flexibly select any material in accordance with the disclosure.

The frame 105 can include a first end 106A and a second end 106B. Both the first end 106A and the second end 106B can be located at opposite distal ends of the frame 105. The first end 106A can include a first guide slot 107A. The second end 106B can include a second guide slot 107B. The first and second guide slots 107A and 107B are discussed in greater detail below. In alternative embodiments, the first end 106A can include other securing means. Further, the second end 106B can include other securing means. The GPGPU carrier 100 can also include a Peripheral Component Interconnect Express ("PCIe") interface 101. The PCIe interface 101 can include an interface to connect to a PCIe cable (not shown). The PCIe cable (not shown) can be connected to a PCIe component (not shown) located remote. In some embodiments, the PCIe component is located within the server component of the GPGPU carrier 100. In alternative embodiments, the PCIe component is located remote from the server component of the GPGPU carrier 100.

Figure 2:
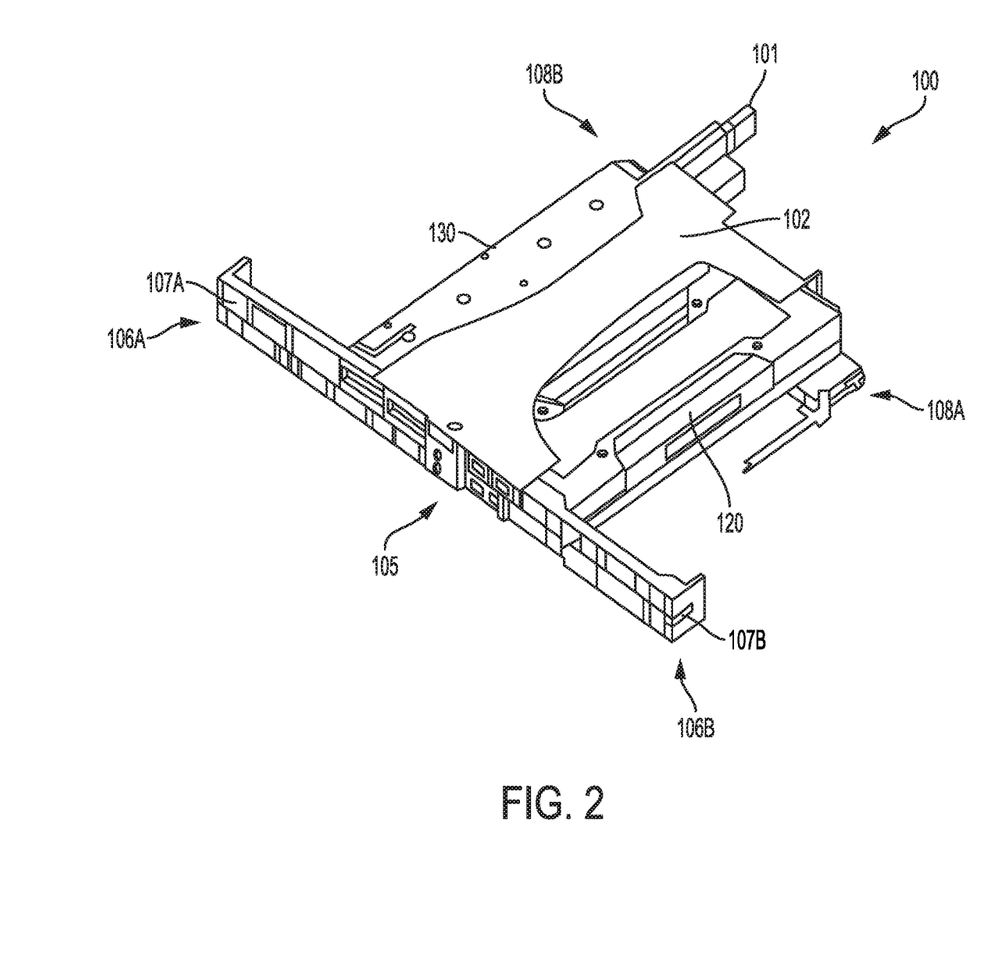
FIG. 2 is a top isometric views of a GPGPU carrier of FIG. 1, with the first and second GPGPUs installed according to an embodiment.

FIG. 2 is a top isometric view of a GPGPU carrier 100 with the first GPGPU 120 and the second GPGPU 130 installed according to an embodiment. In the exemplary configuration of FIG. 2, a first locking mechanism 108A can be located on the bracket 102. Further, a second locking mechanism 108B can be located on the bracket 102. The locking mechanism can include a latch mechanism, a spring and lock feature, or any other locking mechanism known in the art. In some embodiments, a connection feature can be located beneath the base of the bracket 102. Thus, when the GPGPU carrier 100 is installed within a server device (not shown), the first and second GPGPUs 120, 130 can be connected to a mother board (discussed below).

Figure 7:
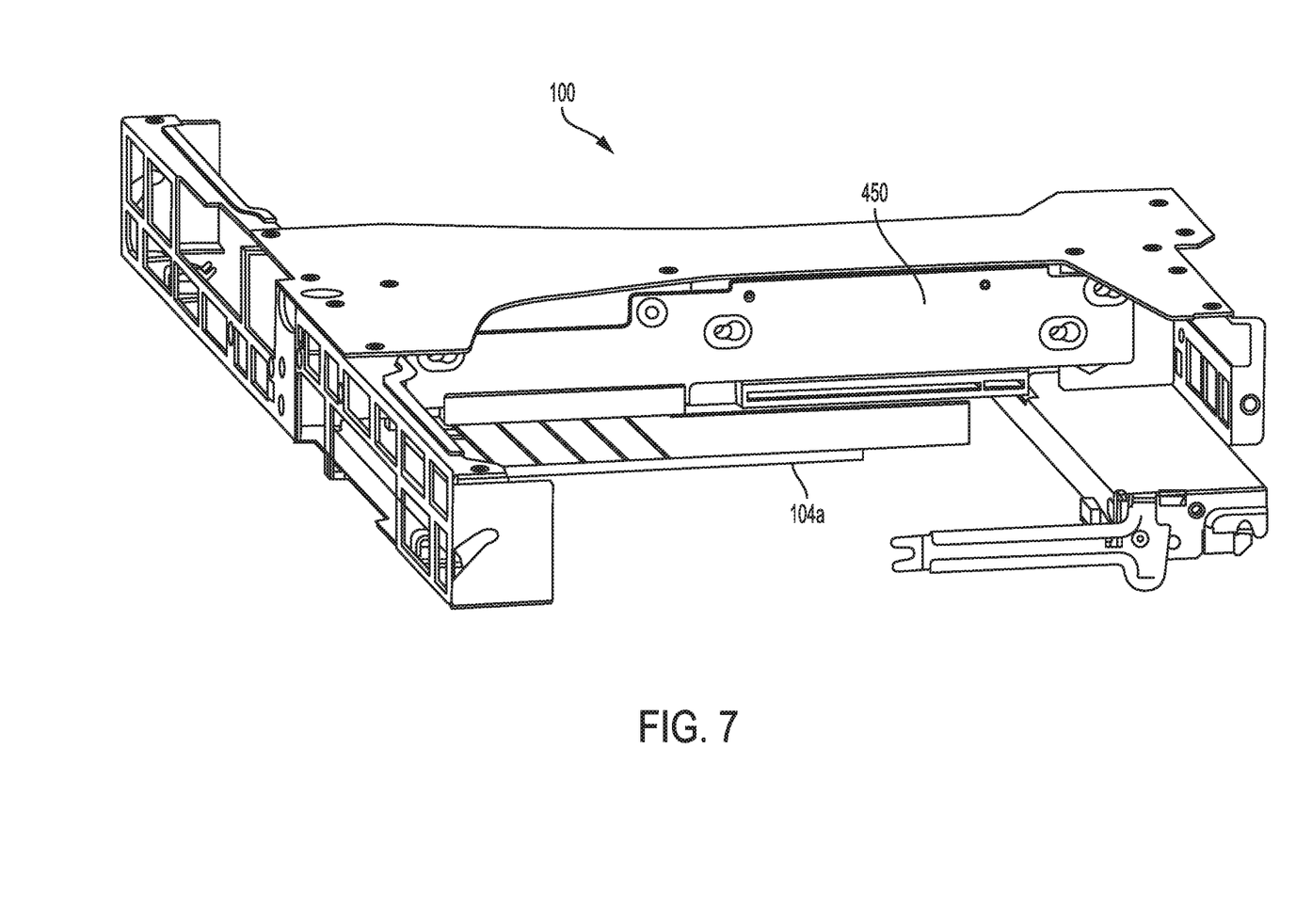
FIG. 7 shows a left isometric view of the GPGPU carrier of FIG. 1.
Figure 8:
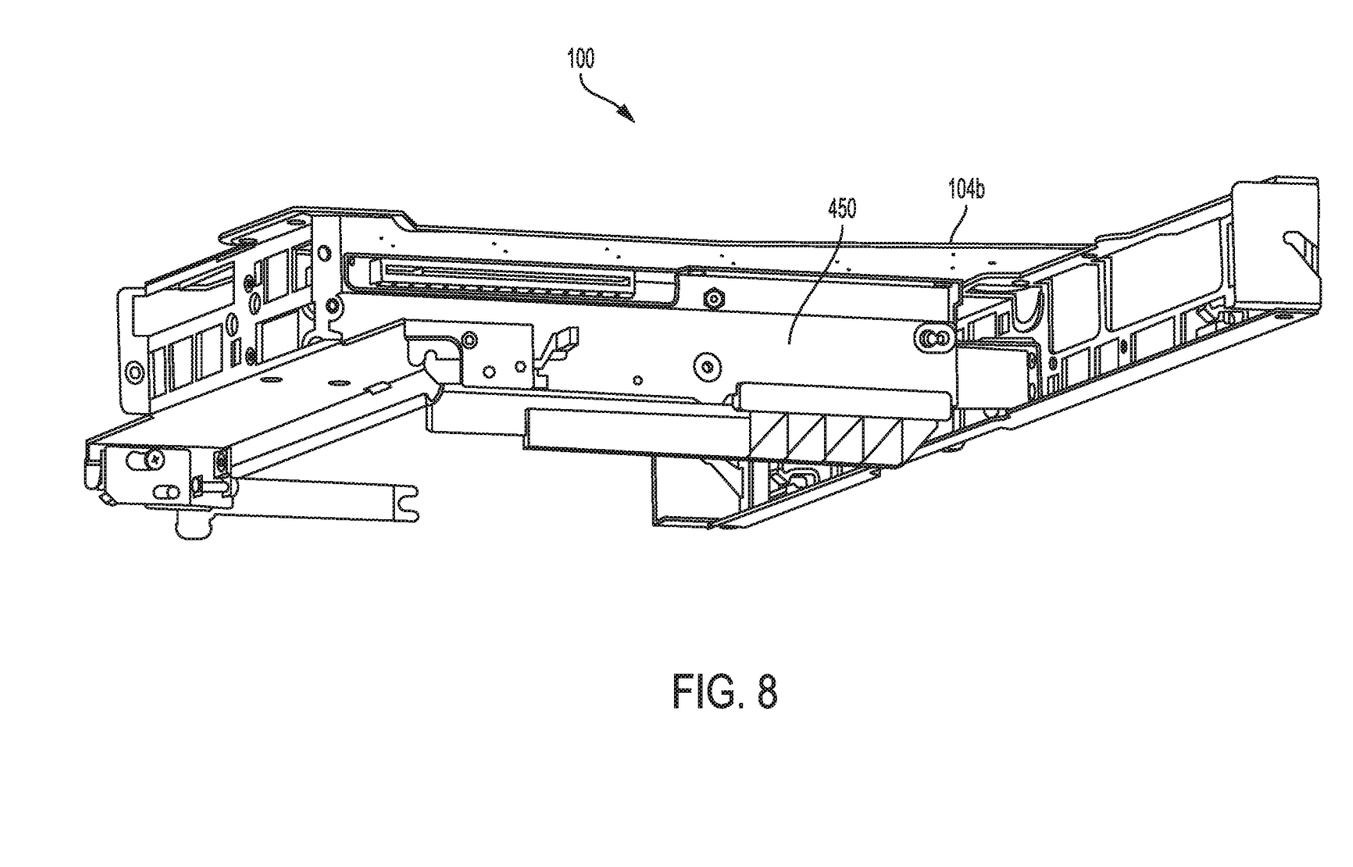
FIG. 8 shows a right isometric view of the GPGPU carrier of FIG. 1.

Referring momentarily to FIG. 7 and FIG. 8, the GPGPU carrier 100 is shown in various orientations. FIG. 7 shows a left isometric view of a GPGPU carrier 100. FIG. 7 shows the GPGPU carrier 100 and the first receiving space 104A absent a GPGPU component. FIG. 8 shows a right isometric view of a GPGPU carrier 100 and the second receiving space 104B absent a GPGPU component. FIG. 7 and FIG. 8 also show an adapter 450 to receive a connector (not shown) at the GPGPU carrier 100. The adapter 450 of the GPGPU carrier 100 engages to a connector (not shown) of the motherboard (not shown).

Figure 3:
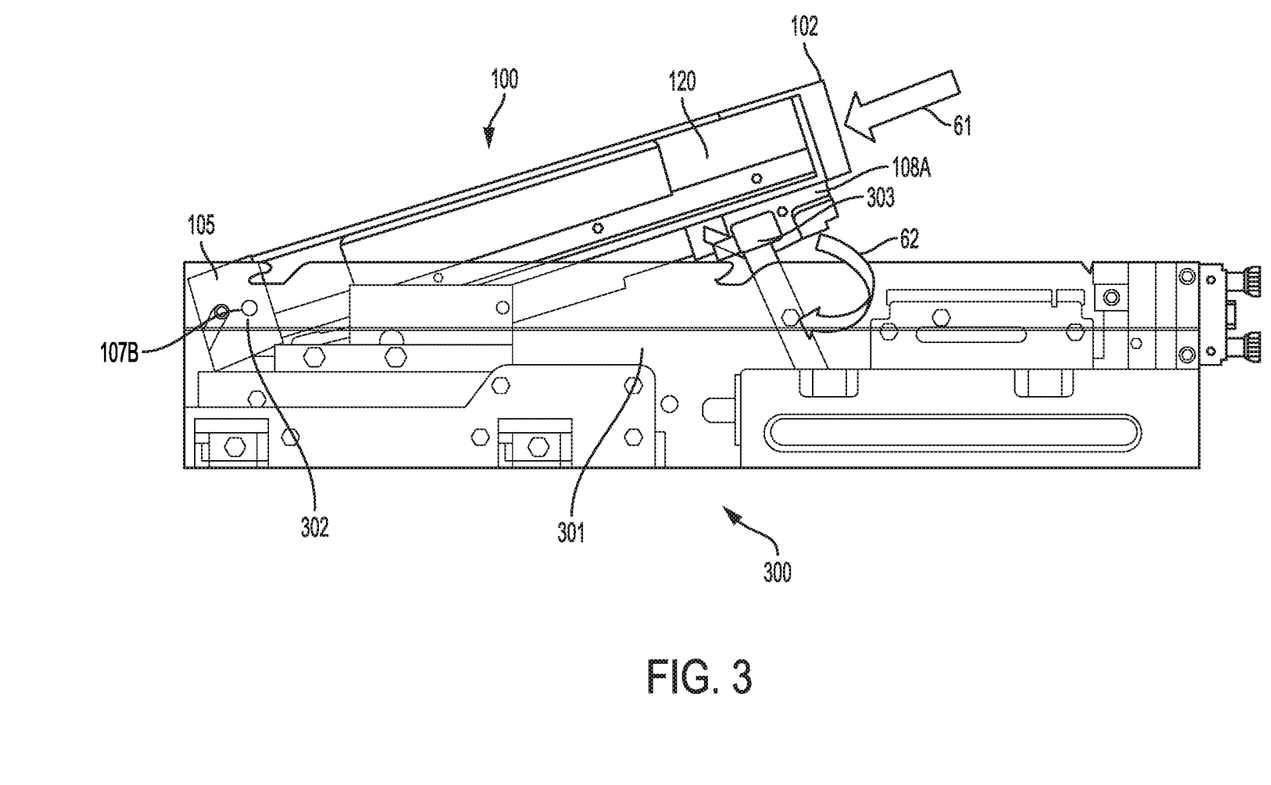
FIG. 3 show the GPGPU carrier of FIGS. 1 and 2 being inserted into a slot within a motherboard according to an embodiment.

FIG. 3 show the GPGPU carrier 100 of FIGS. 1, 2, 7 and 8 inserted into a slot 301 within a motherboard 300 according to an embodiment. The motherboard 300 includes a slot 301 configured to receive a GPGPU carrier 100 when both the first and second GPGPU 120, 130 are installed. The GPGPU carrier 100 can be slid into the slot 301 in direction 61. The GPGPU carrier 100 can be secured by guide pins 302, and locking mechanisms 303 within the slot 301. The guide pins 302 are configured to secure the corresponding guide slots 107A, 107B (shown in FIG. 2). The guide pins 302 have a first position and a second position in the slot 301. In the first position, the GPGPU carrier 100 can rotate freely. In the second position, rotation is limited so the GPGPU carrier 100 is fixed in place to allow access to components located beneath it. The second position is shown in FIG. 3.

Figure 6:
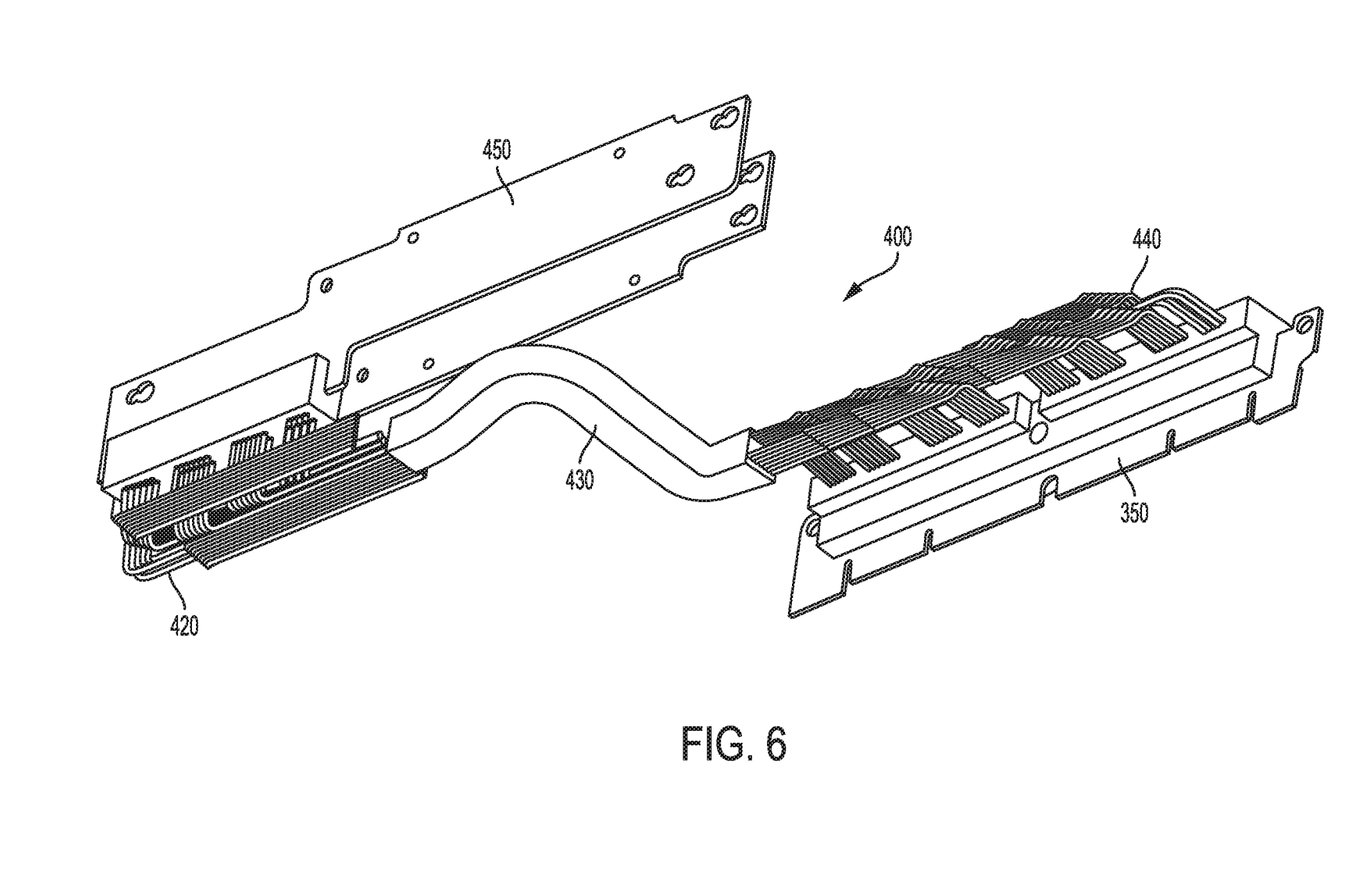
FIG. 6 shows a connector to connect the GPGPU carrier of FIG. 1 to the motherboard of a computing device of FIG. 5.

Referring momentarily to FIG. 6, a connector 400 is shown connected to the adapter 450 of the GPGPU carrier (shown in FIGS. 1, 2, 7 and 8). The connector 400 has a first receiver 420, a flexible member 430, and a second receiver 440. The first receiver 420 is configured to connect to the adapter 450 of the GPGPU carrier (shown in FIG. 3). The second receiver 440 can be configured to connect to an adapter 350 of the motherboard (shown in FIG. 3). The flexible member 430 can include electrical components for facilitating an electrical connection between the first and second GPGPUs installed within the GPGPU carrier to the motherboard (see FIG. 10). The flexible member 430 enables the GPGPU carrier 100 to vary between a first and second position (discussed below) and remain connected to the motherboard. This feature is discussed below in greater detail.

Figure 11:
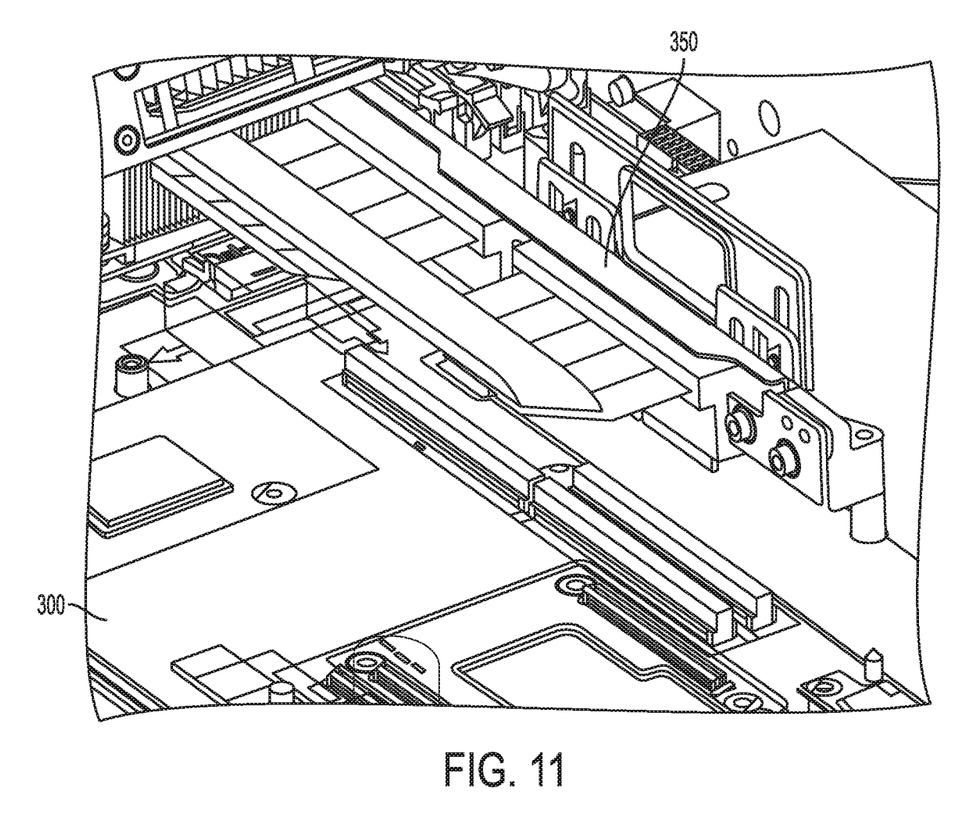
FIG. 11 shows the adapter within the motherboard configured to connect to the GPGPU carrier.

Referring momentarily to FIG. 11, the adapter 350 of the motherboard 300 is shown herein. As described above, the connector 400 can be configured to connect an adapter of the GPGPU carrier to the adapter 350 of the motherboard 100. The connection facilitates an electrical connection between the first and second GPGPUs installed within the GPGPU carrier to the motherboard 300.

Referring back to FIG. 3, the slot 301 and the guide pins 302 enable the GPGPU carrier 100 to rotate to this position about direction 62. The slot 301 and the guide pins 302 enable the GPGPU carrier 100 to be held in place in this position to enable access underneath the GPGPU carrier 100. This enables a technician to be able to access other components without disconnecting the GPGPU carrier 100.

Figure 9:
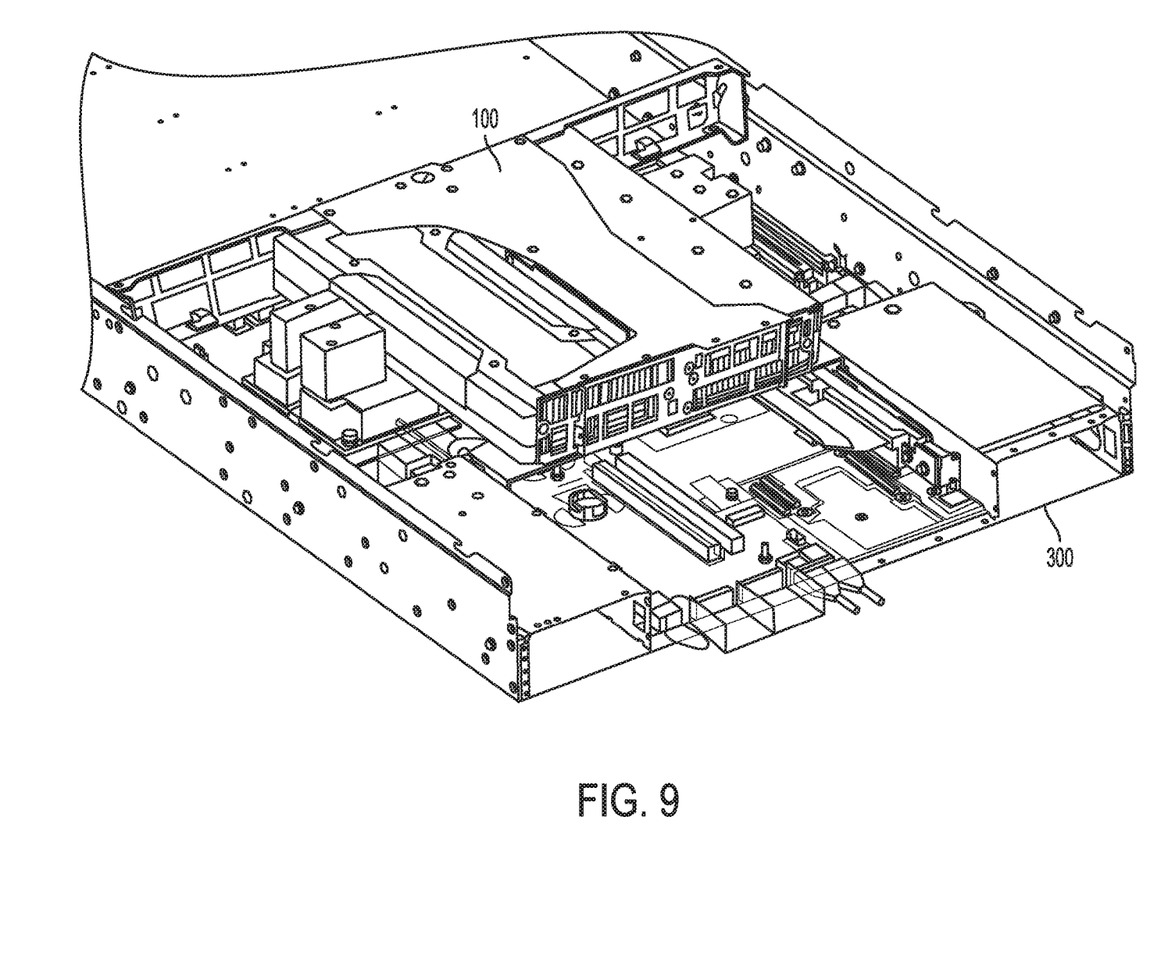
FIG. 9 shows a detailed view of the GPGPU carrier within the first position within the motherboard of a computing device.
Figure 10:
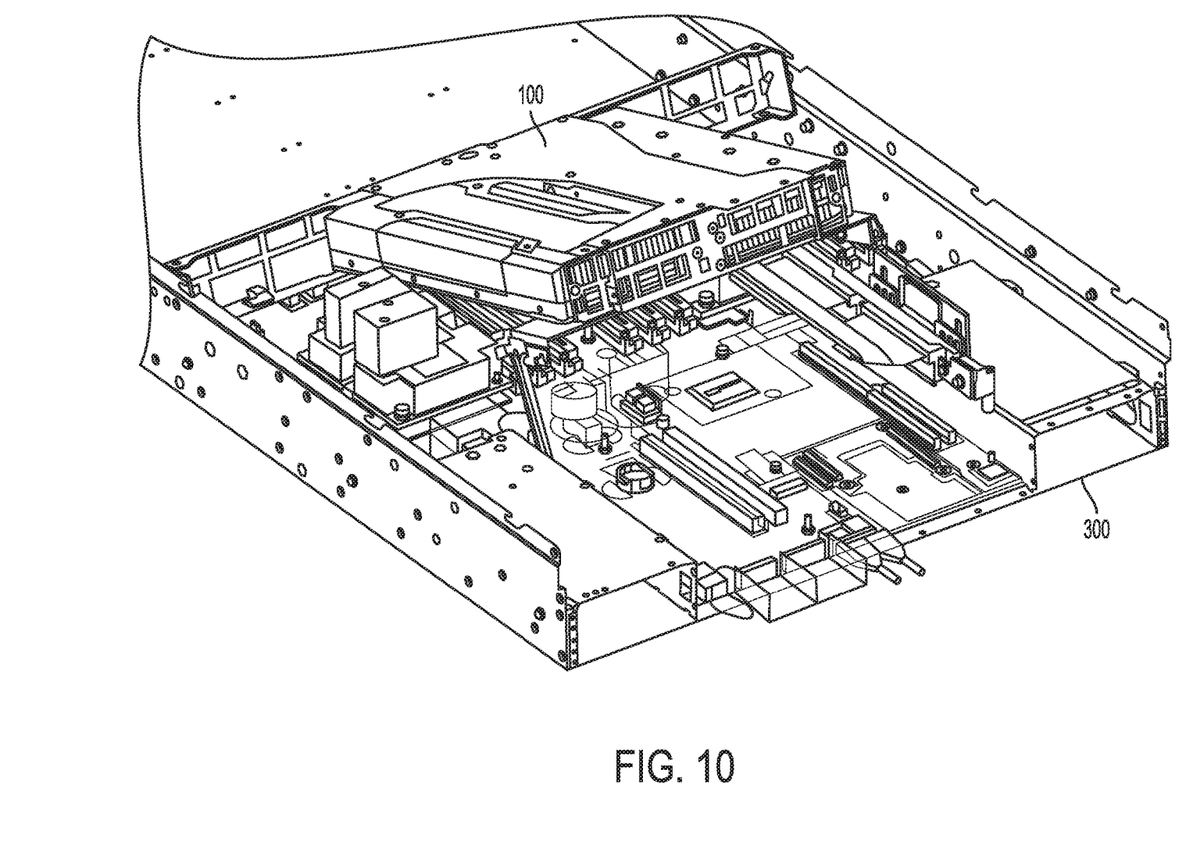
FIG. 10 shows a detailed view of the GPGPU carrier within the second position within the motherboard of a computing device.

Referring momentarily to FIG. 9, the GPGPU carrier 100 is within the first position within the motherboard 300. FIG. 10 exemplifies the GPGPU carrier 100 within the second position. The GPGPU carrier 100 is held in place at an angle in this position to enable access components of the motherboard 300 directly beneath the GPGPU carrier 100.

Referring back to FIG. 2 and FIG. 3, the locking mechanisms 303 are configured to secure the corresponding latches 108A, 108B (108B is shown in FIG. 2). For example, the guide pins 302 can engage the guide slots 107A (107A is shown in FIG. 2), 107B when the GPGPU carrier 100 is inserted. In some embodiments, the guide pins 302 can be spring loaded. In other embodiments, the guide pins 302 can be fixed to secure the corresponding guide slots 107A (107A is shown in FIG. 2), 107B. Once the guide pins 302 are secured within the corresponding guide slots 107A (107A is shown in FIG. 2), 107B, the latches 108A, 108B (108B is shown in FIG. 2) can be securely coupled to the locking mechanism 303. This is discussed in greater detail with reference to FIGS. 4A and 4B.

Figure 4A:
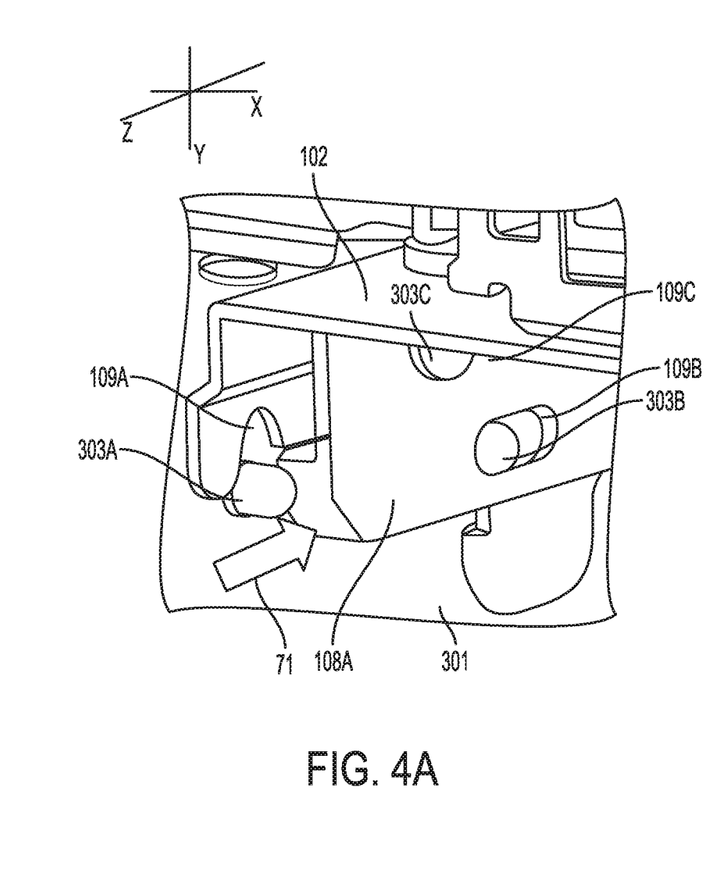
FIG. 4A shows a detailed view of the latch of the GPGPU carrier engaging with the locking mechanisms of the slot.

FIG. 4A shows the latch 108A of the GPGPU carrier 100 engaging with the locking mechanisms 303 (of FIG. 3) of the slot 301. In some embodiments of the invention, the latch 108A can be spring loaded such that it returns back to its original position after being engaged or disengaged to/from the locking mechanisms 303. The locking mechanism 303 can include pin 303A, 303B and 303C. The bracket 102 is pushed down in the y axis, causing the latch 108A to contact and engage with the pin 303A. Upon engaging an angled surface of the locking mechanism 303, the latch 108A moves in direction 71. The pin 303A causes the latch 108A to move in the 71 direction positioning the pin 303B within slot 109B, and pin 303C within slot 109C. Movement of the latch 108A in the 71 direction also exposes slot 109A for the locking mechanism 303A.

Figure 4B:
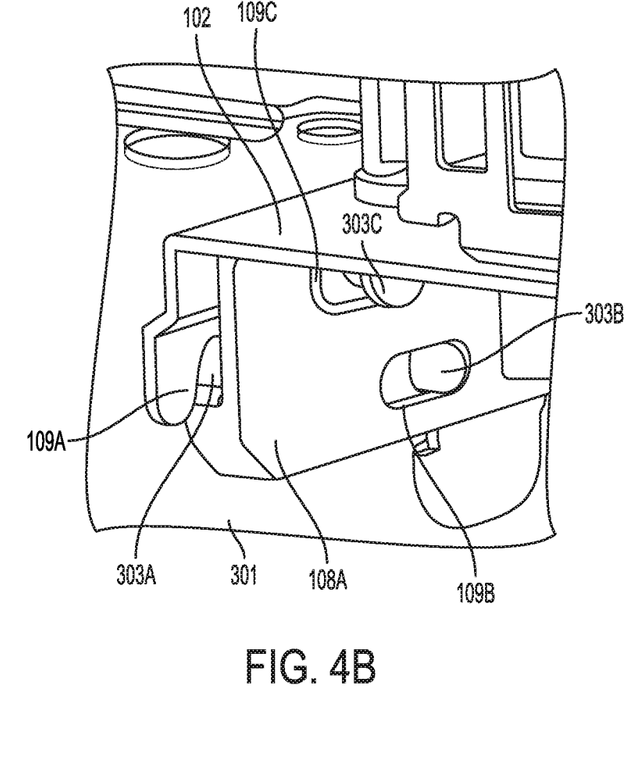
FIG. 4B shows the latch of the GPGPU carrier secured to the locking mechanisms of the slot.

FIG. 4B shows the latch 108A of the GPGPU carrier 100 secured to the locking mechanisms 303 (of FIG. 3) of the slot 301. The locking mechanism 303A slides up into the slot 109A actuating the latch to spring back to the original position (prior to moving in the 71 direction) in the instance the locking mechanism 303A clears the latch 108A. This movement secures the pin 303A within slot 109A; the pin 303B within slot 109B; and the pin 303C within slot 109C. Thus, the latch 108A is secured to the locking mechanism 303 of the slot 301. This process is completed simultaneously with the latch 108B and a corresponding locking mechanism. When unlocking the latch 108A, the latch 108A is pushed in the 71 direction, and the bracket 102 is lifted to clear the locking mechanisms 303.

In the embodiments discussed, the locking mechanism 303 (of FIG. 3) contains a plurality of pins 303A-C. Accordingly, the latch 108A as described contains slots 109A-C. However, it should be noted that the locking mechanisms 303 can include a single pin. Furthermore, the latch 108A can include a single slot to receive a guide pin in the slot 301. A person having ordinary knowledge in the art may flexibly include other configurations of the latch 108A as it pertains to securing the GPGPU carrier 100 within the slot 301.

Figure 12:
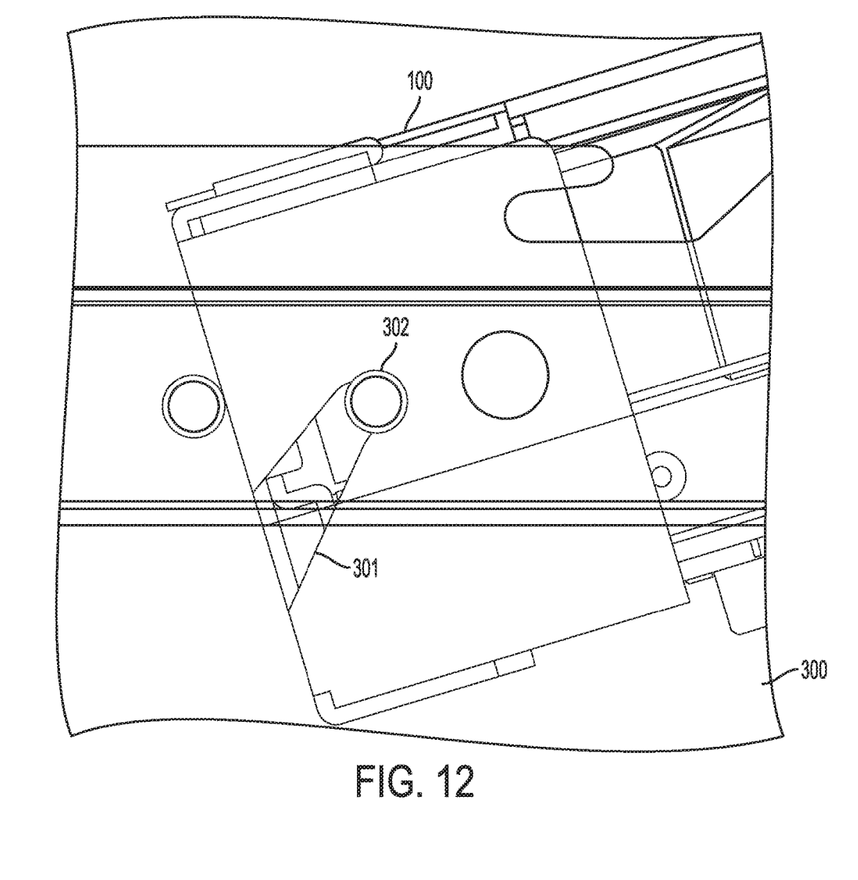
FIG. 12 shows the guide pins of the GPGPU carrier configured within the slot in the second position.
Figure 13:
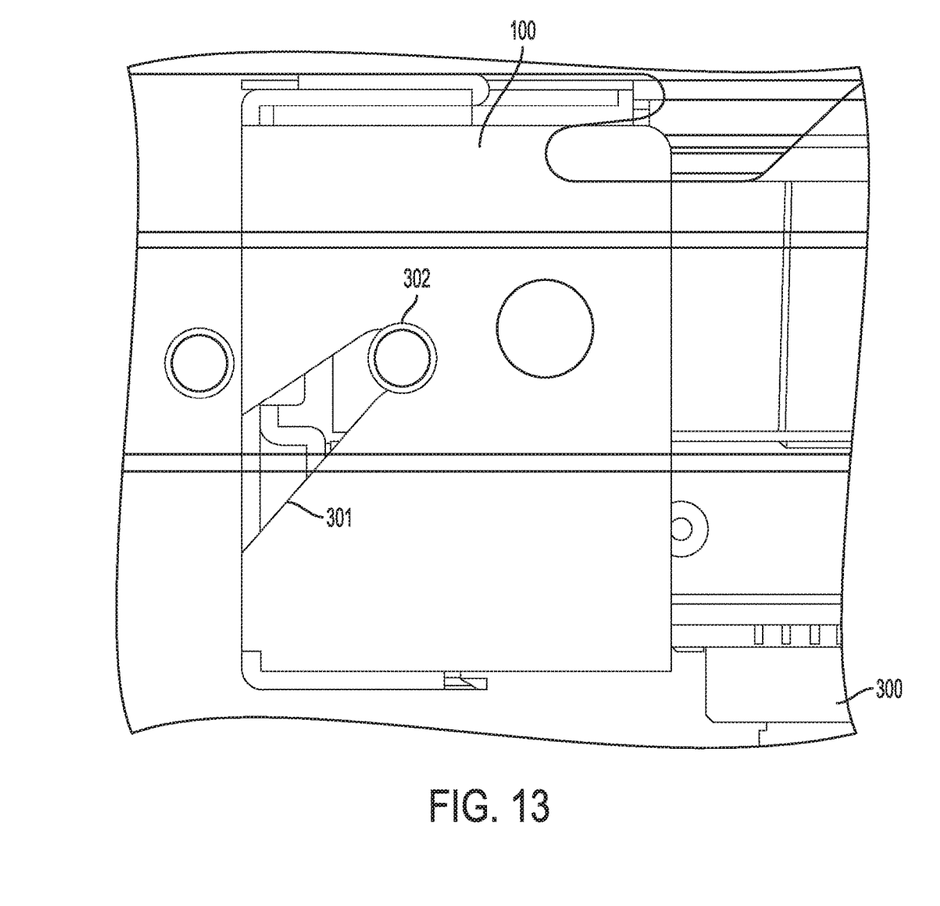
FIG. 13 shows the guide pins of the GPGPU carrier configured within the slot in the first position.

Referring momentarily to FIG. 12 and FIG. 13, the slot 301 of the motherboard 300 is configured to secure the guide pins 302 of the GPGPU carrier 100. The GPGPU carrier 100 can rotate freely between a first and second position, as discussed above. The guide pins 302 enable the GPGPU carrier 100 to rotate between a first position and a second position in the slot 301. FIG. 12 shows the guide pins 302 of the GPGPU carrier 100 configured within the slot 301 in the second position. In the second position, the GPGPU carrier 100 is fixed in place to allow access to components of the motherboard 300 located beneath it. FIG. 13 shows the guide pins 302 of the GPGPU carrier 100 configured within the slot 301 in the first position.

Figure 5:
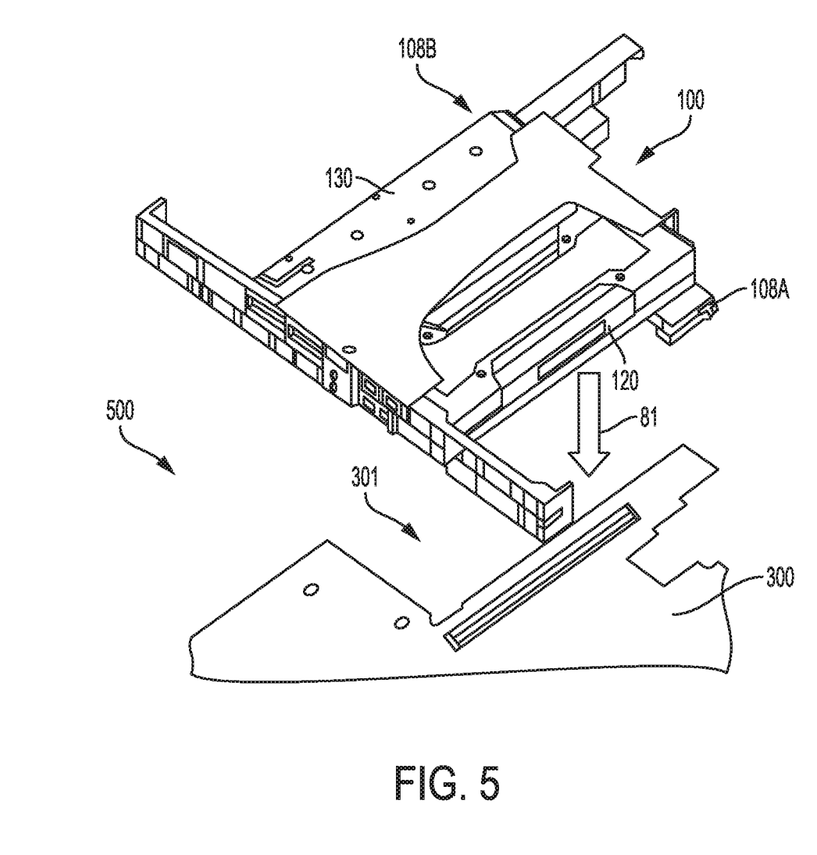
FIG. 5 shows the GPGPU carrier of FIG. 1 being inserted into a slot within a motherboard of a computing device.

Now that the configuration and operation of the GPGPU carrier 100 has been described, the disclosure now turns to a description of the configuration and operation of motherboard slot for receiving the GPGPU carrier 100. FIG. 5 shows the GPGPU carrier 100 (of FIG. 1) being inserted into a slot 301 within a motherboard 300 of a computing device 500. The GPGPU carrier 100 is configured in a loading position with both the first GPGPU 120 and the second GPGPU 130 installed according to an embodiment. The computing device 500 can be a standalone computer, a server, or any other type of computing device.

In this configuration, the interaction of the latches 108A, 108B of the GPGPU carrier 100 and the locking mechanisms 303 (shown in FIG. 3) of the slot 301 operates to cause the connector (shown in FIG. 6) of the GPGPU carrier 100 to engage the connector (shown in FIG. 11) of the motherboard 300. It should be noted, that in some embodiments releasing the latches 108A, 108B of the GPGPU carrier 100 and the locking mechanisms 303 (shown in FIG. 3) of the slot 301 does not disconnect a connector. Thus, this allows a technician to service either the first or second GPGPU 120 or 130, without disconnecting the GPGPU carrier 100 from the motherboard 300.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art, upon reading and understanding this specification and the annexed drawings. In addition, while a particular feature of the invention may have been disclosed with respect to only one of several implementations, such feature may be combined with one or more other features of the other implementations, as may be desired and advantageous for any given or particular application.

The terminology used herein is for the purpose of describing particular embodiments only and is not intended to limit the invention. As used herein, the singular forms "a", "an", and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. An apparatus, comprising:
   at least one slot, the at least one slot that comprises a first locking element and a second locking element configured to receive a carrier; and
   the carrier for removable insertion into the at least one slot, the carrier comprising:
      a bracket comprising a first receiving space for securing a first computing device, a second receiving space for securing a second computing device, a first latching mechanism configured to secure the first locking element of the slot and a second latching mechanism configured to secure the second locking element of the slot, and
      a frame secured to the bracket, wherein the frame comprises a first end, with a first guide slot and a second end with a second guide slot configured to secure the carrier within the slot, wherein the first and second guide slots are configured to enable the carrier to adjust from a first position to a second position while secured within the slot.

2. The apparatus of claim 1, wherein the at least one slot comprises a connector for engaging a corresponding connector of the computing device carrier.

3. The apparatus of claim 2, wherein the connector comprises a first adapter of the computing device carrier, a first receiver connected to the first adapter, a second adapter of a motherboard, and a second receiver connected to the second adapter.

4. The apparatus of claim 3, wherein the first receiver and the second receiver are connected by a flexible member.

5. The apparatus of claim 4, wherein the flexible member includes electrical components for facilitating an electrical connection between the first computing device installed within the carrier and the motherboard.

6. The apparatus of claim 5, wherein the flexible member enables the carrier to remain connected to the motherboard while being adjusted from the first position to the second position.

7. The apparatus of claim 1, wherein the carrier further comprises a PCIe interface connected to a PCIe cable.

8. The apparatus of claim 1, wherein the frame is secured to the bracket by at least one of fasteners, screws, and spot welding.

9. The apparatus of claim 1, wherein the first locking mechanism and the second locking mechanism comprises a latch mechanism.

10. The apparatus of claim 1, wherein the first locking mechanism and the second locking mechanism comprises a spring and lock mechanism.

11. A computing device carrier comprising:
    a bracket comprising a first receiving space for securing a first computing device, a second receiving space for securing a second computing device, a first latching mechanism and a second latching mechanism; and
    a frame secured to the bracket, wherein the frame comprises a first end with a first guide slot and a second end with a second guide slot configured to secure the computing device carrier within a motherboard slot, wherein the first and second guide slots are configured to enable the computing device carrier to adjust from a first position to a second position while secured within the motherboard slot,
    wherein the motherboard slot comprises a first locking element and a second locking element,
    wherein the first latching mechanism secured to the first locking element of the motherboard slot and the second latching element secured to the second locking element of the motherboard slot.

12. The computing device carrier of claim 11, wherein the computing device carrier is configured to be removably inserted into at least one slot, the at least one slot comprising a connector for engaging a corresponding connector of the computing device carrier.

13. The computing device carrier of claim 12, wherein the connector comprises a first adapter of the computing device carrier, a first receiver connected to the first adapter, a second adapter of a motherboard, and a second receiver connected to the second adapter.

14. The computing device carrier of claim 13, wherein the first receiver and the second receiver are connected by a flexible member.

15. The computing device carrier of claim 14, wherein the flexible member includes electrical components for facilitating an electrical connection between the first computing device installed within the computing device carrier and the motherboard.

16. The computing device carrier of claim 15, wherein the flexible member enables the computing device carrier to remain connected to the motherboard while being adjusted from the first position to the second position.

17. The computing device carrier of claim 12, wherein the first locking mechanism and the second locking mechanism comprises a latch mechanism.

18. The computing device carrier of claim 12, wherein the first locking mechanism and the second locking mechanism comprises a spring and lock mechanism.

19. The computing device carrier of claim 11, wherein the computing device carrier further comprises a PCIe interface connected to a PCIe cable.

20. The computing device carrier of claim 11, wherein the frame is secured to the bracket by at least one of fasteners, screws, and spot welding.

\* \* \* \* \*